United States Patent
Tsugane et al.

(10) Patent No.: US 12,048,105 B2
(45) Date of Patent: Jul. 23, 2024

(54) ELECTRICAL JUNCTION BOX

(71) Applicant: Yazaki Corporation, Tokyo (JP)

(72) Inventors: Hitoshi Tsugane, Shizuoka (JP);
Tatsuya Kuratani, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 374 days.

(21) Appl. No.: 17/714,116

(22) Filed: Apr. 5, 2022

(65) Prior Publication Data

US 2022/0330440 A1 Oct. 13, 2022

(30) Foreign Application Priority Data

Apr. 7, 2021 (JP) ................................ 2021-065141

(51) Int. Cl.
*H01R 12/58* (2011.01)
*H01R 12/00* (2006.01)
*H05K 1/18* (2006.01)
*H05K 5/00* (2006.01)

(52) U.S. Cl.
CPC ........... *H05K 5/0069* (2013.01); *H01R 12/58* (2013.01); *H05K 1/18* (2013.01); *H05K 2201/09063* (2013.01); *H05K 2201/09163* (2013.01); *H05K 2201/10189* (2013.01)

(58) Field of Classification Search
CPC ...... H01R 12/58; H01R 12/7023; H05K 1/18; H05K 2201/09063; H05K 2201/09163; H05K 2201/10189; H05K 5/0069; H05K 7/142
See application file for complete search history.

(56) References Cited

U.S. PATENT DOCUMENTS

| | | | | |
|---|---|---|---|---|
| 11,917,785 | B2 * | 2/2024 | Ohtsuka | G03G 15/80 |
| 2013/0242203 | A1 * | 9/2013 | Choi | H04N 5/63 |
| | | | | 348/730 |
| 2015/0287511 | A1 * | 10/2015 | Furukawa | H01F 27/02 |
| | | | | 336/84 R |
| 2017/0318696 | A1 * | 11/2017 | Sekido | H05K 5/0026 |
| 2020/0120817 | A1 * | 4/2020 | Oda | H05K 5/0069 |

FOREIGN PATENT DOCUMENTS

| | | |
|---|---|---|
| JP | 2008-166180 A | 7/2008 |
| JP | 2016-86638 A | 5/2016 |
| WO | 2016/079835 A1 | 5/2016 |

* cited by examiner

*Primary Examiner* — Abdullah A Riyami
*Assistant Examiner* — Thang H Nguyen
(74) *Attorney, Agent, or Firm* — KENEALY VAIDYA LLP

(57) ABSTRACT

In an electrical junction box, a positioning rib is inserted into a slit in an abutment state in which a circuit board is in abutment with a positioning surface. Projecting portions of a housing are formed projecting from support portions toward the circuit board, and are inserted through penetration holes of the circuit board. Each projecting portion includes a plurality of divided pieces formed elastically deformable in a radial direction. The divided piece has a regulation portion that regulates movement in an insertion and removal direction of the circuit board between the regulation portion and the support portion.

7 Claims, 9 Drawing Sheets

FIG.1
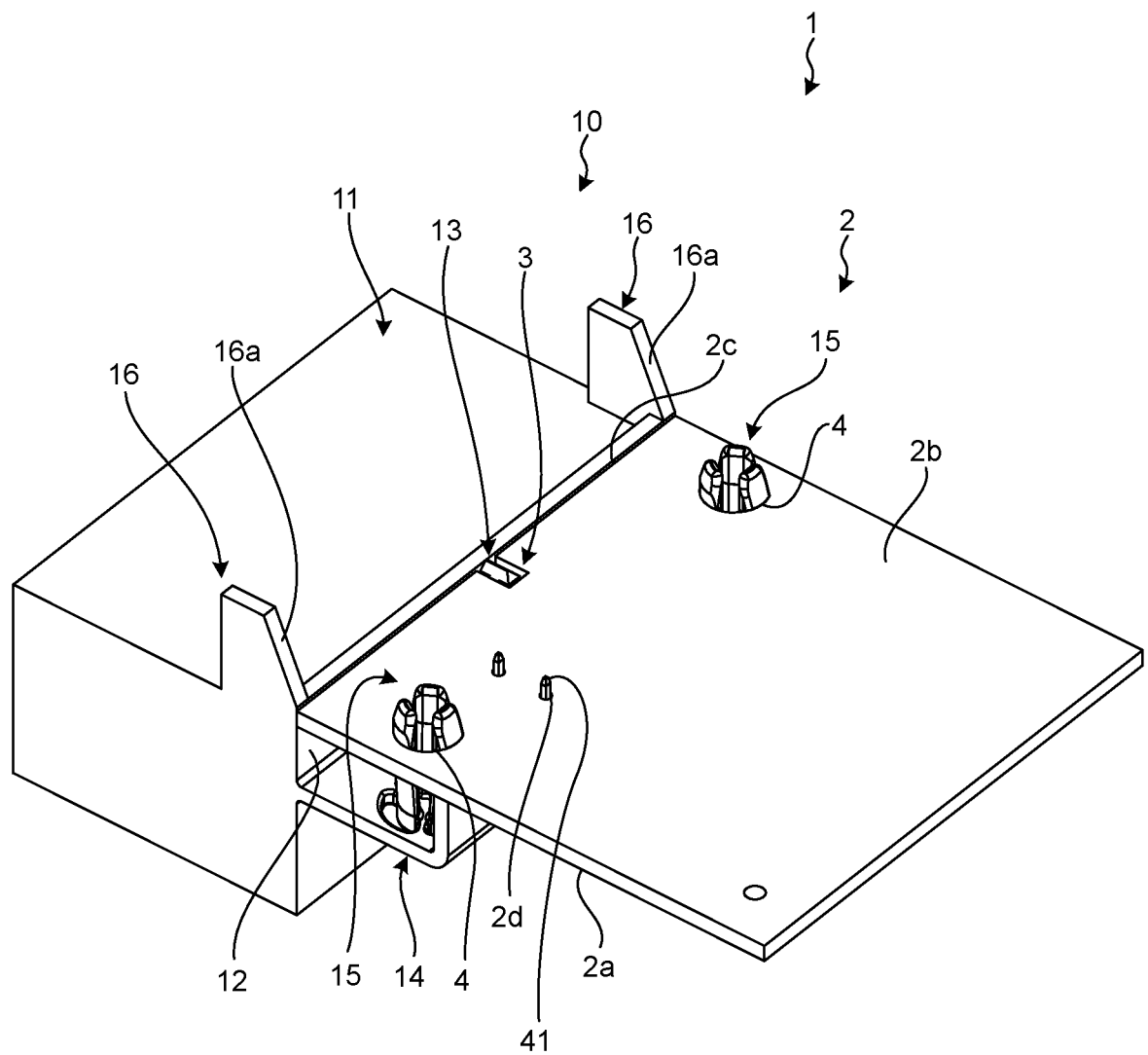
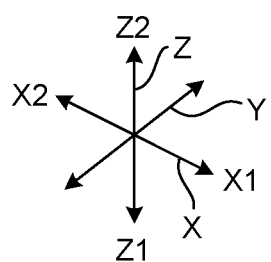

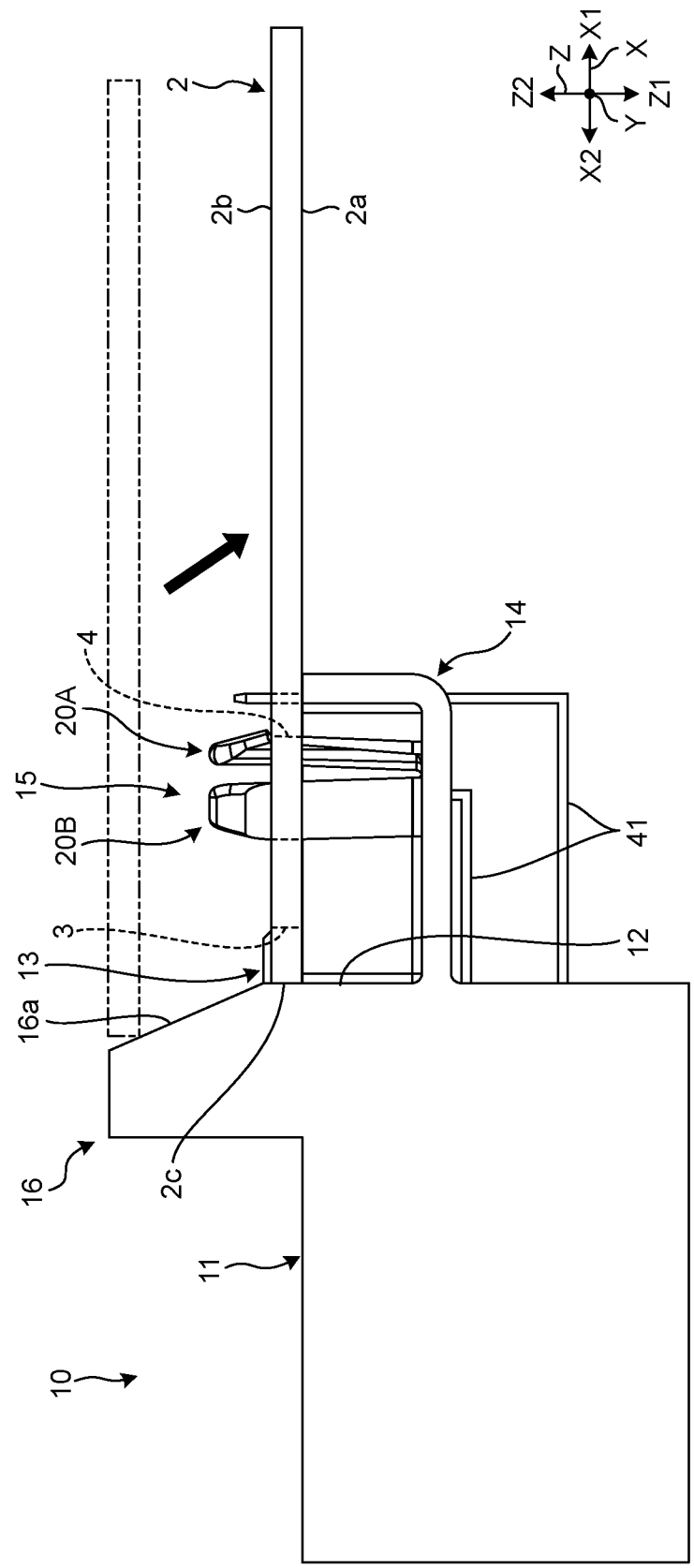

ELECTRICAL JUNCTION BOX

CROSS-REFERENCE TO RELATED APPLICATION(S)

The present application claims priority to and incorporates by reference the entire contents of Japanese Patent Application No. 2021-065141 filed in Japan on Apr. 7, 2021.

BACKGROUND OF THE INVENTION

1. Field of the Invention

The present invention relates to an electrical junction box.

2. Description of the Related Art

For example, Japanese Patent Application Laid-open No. 2016-86638 discloses an electrical junction box that is assembled by temporarily fixing and soldering a circuit board to a board connector and accommodating the board connector and the circuit board in a case, as a technique concerning conventional electrical junction boxes applied to vehicles or the like.

To fix the circuit board to the board connector, the board connector and the circuit board are sequentially set in a box-shaped support jig, and a protective cover for electronic components is attached to the circuit board. After that, the circuit board is screwed to the board connector, and the protective cover and the support jig are removed therefrom. The protective cover for electronic components is formed so as to cover an entire board surface, and is used for preventing the electronic components mounted on the circuit board from being destroyed by a screwing bit tip when an assembly worker screws the circuit board to the board connector.

Unfortunately, it is necessary for the assembly worker to attach and remove the protective cover, and it takes time to perform the screwing work in the above conventional assembly method. Thus, there is room for improvement in terms of working costs and component costs while protecting the electronic components mounted on the board.

SUMMARY OF THE INVENTION

It is an object of the present invention to provide an electrical junction box that allows for easy fixing of a circuit board to a board connector while protecting electronic components.

To achieve the above object, an electrical junction box according to one aspect of the present invention includes a circuit board; and a board connector including a housing holding a connection terminal and fixed to the circuit board, wherein the circuit board includes a slit provided in a linear end, and a plurality of penetration holes provided at positions different from a through hole to which the connection terminal is soldered, and arranged parallel to the end with the slit therebetween, the housing includes a positioning surface in abutment with the end of the circuit board, a positioning rib formed projecting from the positioning surface in a perpendicular direction perpendicular to the positioning surface, and inserted into the slit to come into contact with the circuit board at least in a width direction of the slit in an abutment state in which the end of the circuit board is in abutment with the positioning surface, a support portion formed corresponding to each of the penetration holes, formed projecting from the positioning surface and extending toward the circuit board, and coming into abutment with a first surface of the circuit board in the abutment state to support the circuit board, and a projecting portion formed projecting from the support portion toward the circuit board, and inserted through each of the penetration holes, the projecting portion includes a plurality of divided pieces circumferentially divided by a plurality of slits extending toward an axis from an outer peripheral surface so as to be formed individually elastically deformable in a radial direction, a regulation portion formed projecting radially outward from the outer peripheral surface and regulating movement in an insertion and removal direction of the circuit board between the regulation portion and the support portion in an insertion state in which the projecting portion is inserted through the penetration hole is formed in at least one of the divided pieces, the connection terminal comes into an insertion state through the through hole of the circuit board in an insertion state in which the positioning rib is inserted into the slit, and in a state in which the projecting portion is inserted through the penetration hole to regulate the movement of the circuit board by the regulation portion, and the board connector is fixed to the circuit board by soldering the connection terminal to the through hole.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a perspective view illustrating a schematic configuration of an electrical junction box according to an embodiment;

FIG. 5 is a side view illustrating the schematic configuration of the fixing structure in the electrical junction box according to the embodiment;

DETAILED DESCRIPTION OF THE PREFERRED EMBODIMENTS

Figure 2:
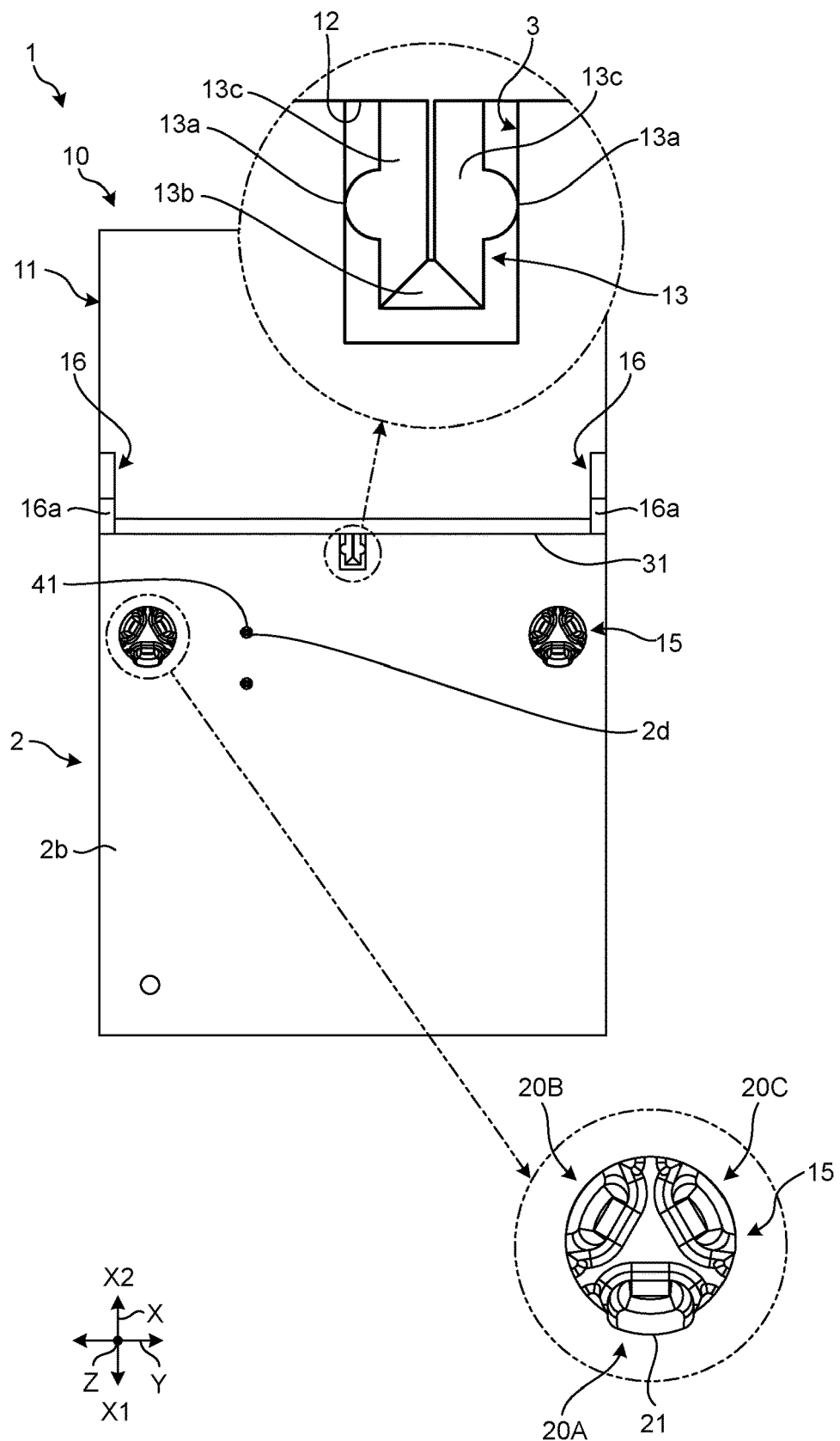
FIG. 2 is a plan view illustrating the schematic configuration of the electrical junction box according to the embodiment.

Hereinafter, an embodiment according to the present invention will be described in detail based on the drawings. Note that the embodiment does not intend to limit the present invention. Additionally, constituent elements in the following embodiment include those easily conceivable by a person skilled in the art or those substantially identical with the constituent elements. Moreover, various omissions, substitutions, and changes can be made in the constituent elements in the following embodiment without departing from the scope of the invention.

In the following description, an X direction in the drawings is a depth direction (or a perpendicular direction) of an electrical junction box in the embodiment, a Y direction is a width direction thereof, and a Z direction is an insertion and removal direction thereof. The X direction, the Y direction, and the Z direction are perpendicular to one another. A first side in the X direction is an X1 direction, and a second side therein is an X2 direction. A first side in the Z direction is a Z1 direction (insertion direction), and a second side therein is a Z2 direction (removal direction). Additionally, each direction used in the following description indicates a direction in a state in which respective portions are put together unless otherwise specified. Moreover, the depth direction and the width direction are not limited to a horizontal direction, and the insertion and removal direction is not limited to a vertical direction.

EMBODIMENT

An electrical junction box 1 according to the present embodiment illustrated in FIG. 1 is mounted in, for example, a vehicle such as an automobile. The electrical junction box 1 includes a circuit board 2 and a board connector 10 as illustrated in FIGS. 1 and 2. The electrical junction box 1 is unitized by accommodating these constituent elements in a case (not illustrated) and putting the elements together.

The circuit board 2 constitutes an electronic circuit that electrically connects a plurality of electronic components mounted thereon. The circuit board 2 includes a plurality of through holes 2d. Connection terminals 41 are soldered to the through holes 2d with their ends inserted therethrough. The circuit board 2 is electrically connected to a connector terminal held by the board connector 10, via the connection terminals 41 soldered to the through holes 2d. The circuit board 2 is configured by, for example, a so-called printed circuit board (PCB). In the circuit board 2, a wiring pattern (print pattern) of a conductive material such as copper, printed on an insulating layer made of an insulating material such as epoxy resin, glass epoxy resin, paper epoxy resin, and ceramics, constitutes a circuit body. The circuit board 2 is formed in a substantially square plate shape whose plate thickness direction is the insertion and removal direction. The circuit board 2 extends along the depth direction and the width direction. Here, the depth direction of the circuit board 2 is a long side direction, and the width direction thereof is a short side direction. The circuit board 2 has a first surface 2a and a second surface 2b. The first surface 2a is, for example, partially supported by a portion of the board connector 10. The second surface 2b is a mounting surface where, for example, the unillustrated electronic components and the connection terminals 41 are electrically connected to the circuit body by soldering or the like. An end 2c on the second side in the depth direction of the circuit board 2 is in abutment with the board connector 10 in a state in which the circuit board 2 is fixed to the board connector 10.

Figure 3:
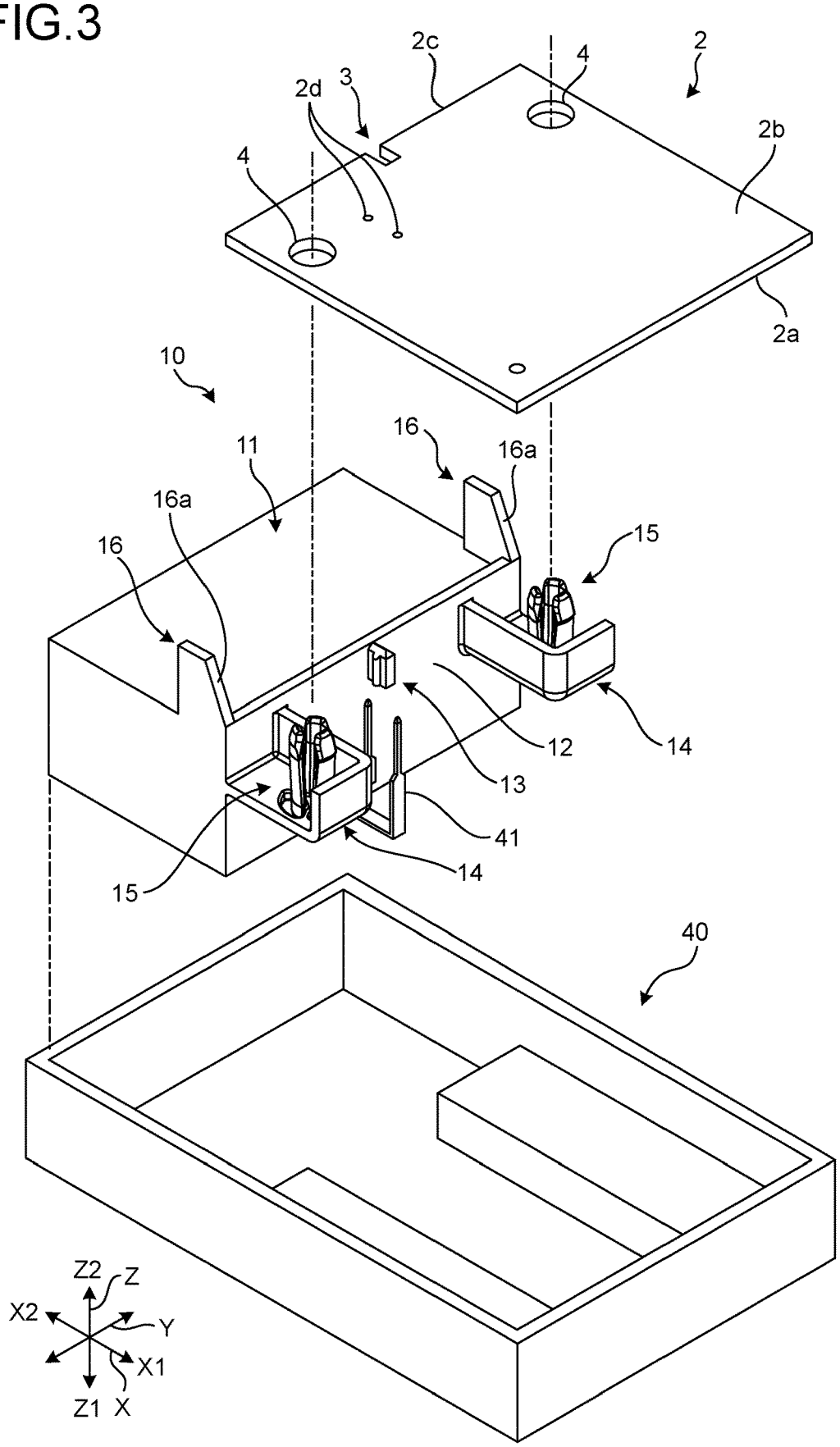
FIG. 3 is an exploded perspective view illustrating the schematic configuration of the electrical junction box according to the embodiment.
Figure 6A:
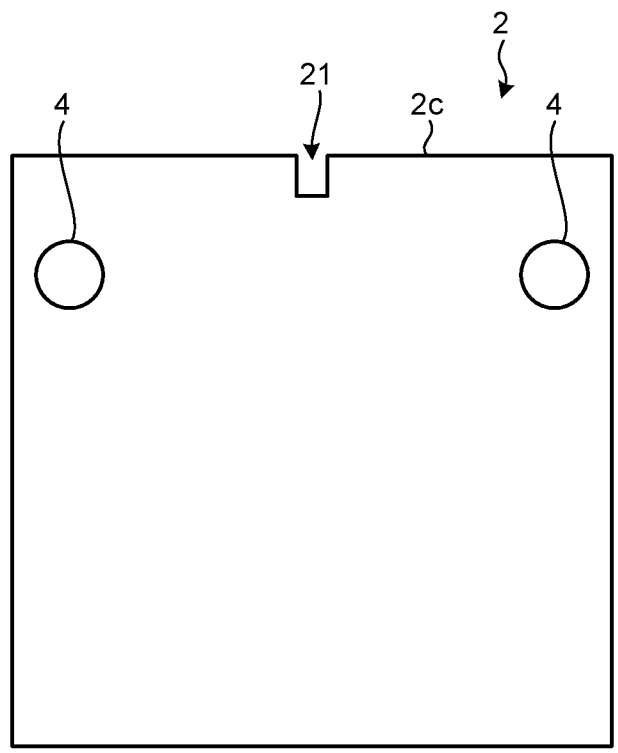
FIG. 6A is a plan view illustrating a schematic configuration of a circuit board according to the embodiment.

The circuit board 2 includes a slit 3 and two penetration holes 4 as illustrated in FIGS. 3, 5, and 6A. The slit 3 is provided in the center of the end 2c that extends linearly in the width direction of the circuit board 2. The two penetration holes 4 are penetration holes different from a so-called through hole. The penetration holes 4 are provided at positions different from the through holes 2d and are arranged parallel to the end 2c with the slit 3 therebetween. For example, a length in the depth direction from the center of each of the penetration holes 4 to the end 2c is larger than a depth (length) in the depth direction of the slit 3.

The board connector 10 includes a housing 11 to be fixed to the circuit board 2. For example, the housing 11 is formed in a box shape using synthetic resin or the like. The housing 11 is opened on the second side in the depth direction. The housing 11 accommodates and holds the connection terminals 41, and a mating connector can be fitted with the housing 11. The connection terminals 41 are formed in, for example, an L shape. The housing 11 holds the connection terminals 41. Each of the connection terminals 41 is a so-called connector terminal, which is physically and electrically connected to a mating connector terminal held by the mating connector in a state in which the housing 11 is fitted with the mating connector. The housing 11 includes a positioning surface 12, a positioning rib 13, a support portion 14, a projecting portion 15, and an inclined rib 16.

The positioning surface 12 is a portion in abutment with the end 2c of the circuit board 2 in the housing 11. The positioning surface 12 is formed in a rectangular shape as viewed from the depth direction, and extends along the width direction and the insertion and removal direction. Here, the width direction of the positioning surface 12 is a long side direction, and the insertion and removal direction thereof is a short side direction. The positioning rib 13 and a pair of the support portions 14 facing each other in the width direction with the positioning rib 13 therebetween are formed on the positioning surface 12. The positioning surface 12 also has a plurality of openings passing in the depth direction. The connection terminals 41 are inserted through the respective openings.

The positioning rib 13 is formed projecting from the positioning surface 12 to the first side in the perpendicular direction perpendicular to the positioning surface 12. The positioning rib 13 is inserted into the slit 3 to come into contact with the circuit board 2 in the width direction of the slit 3 in an abutment state in which the end 2c of the circuit board 2 is in abutment with the positioning surface 12. Here, the perpendicular direction perpendicular to the positioning surface 12 is the depth direction, and the first side is the X1 direction. The positioning rib 13 is formed projecting from the positioning surface 12 toward the circuit board 2 in the above abutment state. The positioning rib 13 is located in the widthwise center and is arranged at an end on the removal direction side of the insertion and removal direction in the positioning surface 12. The positioning rib 13 has a pair of projections 13a, a first inclined surface 13b, and a pair of second inclined surfaces 13c.

The pair of projections 13a are formed projecting outward from outer peripheral surfaces at opposite ends in the width direction of the positioning rib 13. For example, the respective projections 13a extend in the insertion and removal direction, and are formed in a semicircular shape as viewed from the insertion and removal direction. The respective projections 13a have vertices on the opposite end sides in the width direction as viewed from the insertion and removal direction. Each vertex is in abutment with the circuit board 2 in the width direction of the slit 3 in the above abutment state.

The first inclined surface 13b is located on the first side (X1 direction) in the depth direction of the positioning rib 13, and is formed in a triangular shape as viewed from the insertion and removal direction. The first inclined surface 13b is inclined toward the circuit board 2 from the board connector 10, to the insertion direction from the removal direction in the above abutment state.

The pair of second inclined surfaces 13c are formed continuously via the first inclined surface 13b, and are arranged facing each other in the width direction in the positioning rib 13. The respective second inclined surfaces 13c are inclined toward the opposite ends in the width direction, to the insertion direction from the removal direction.

Figure 4A:
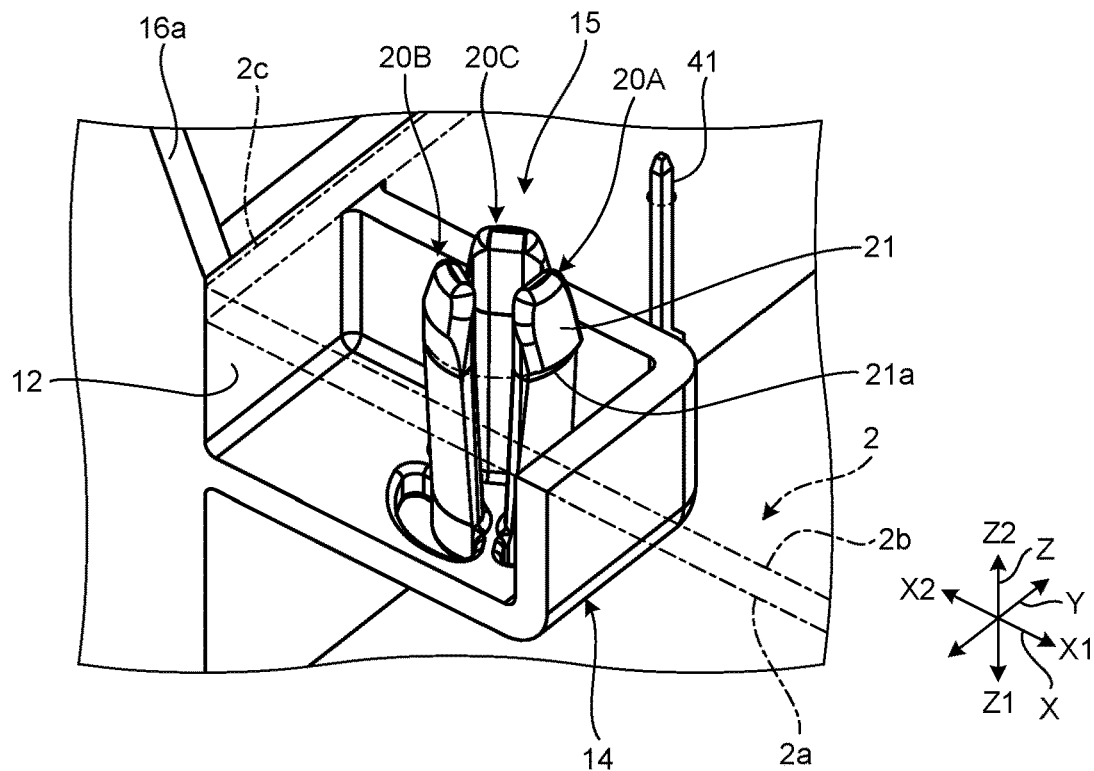
FIG. 4A is a partial perspective view illustrating a schematic configuration of a fixing structure in the electrical junction box according to the embodiment.

As illustrated in FIGS. 3 and 4A, the support portions 14 are formed corresponding to the respective penetration holes 4. The support portions 14 are portions formed projecting from the positioning surface 12 and extending toward the circuit board 2, and coming into abutment with the first surface 2a of the circuit board 2 in the above abutment state to support the circuit board 2. The respective support portions 14 are formed in a box shape, and are opened on the removal direction side and the widthwise outer side.

The projecting portion 15 is formed corresponding to each of the penetration holes 4. The projecting portions 15 are portions formed projecting in the removal direction from the support portions 14 toward the circuit board 2 and inserted through the penetration holes 4. In the present embodiment, a height in the removal direction of the projecting portions 15 is larger than a height in the removal direction of the positioning rib 13. Thus, the projecting portions 15 are inserted through the penetration holes 4 before the positioning rib 13 is inserted into the slit 3 in some cases. Each of the projecting portions 15 includes three divided pieces 20A to 20C circumferentially divided by three slits extending toward its axis from its outer peripheral surface so as to be formed individually elastically deformable in a radial direction.

Figure 4B:
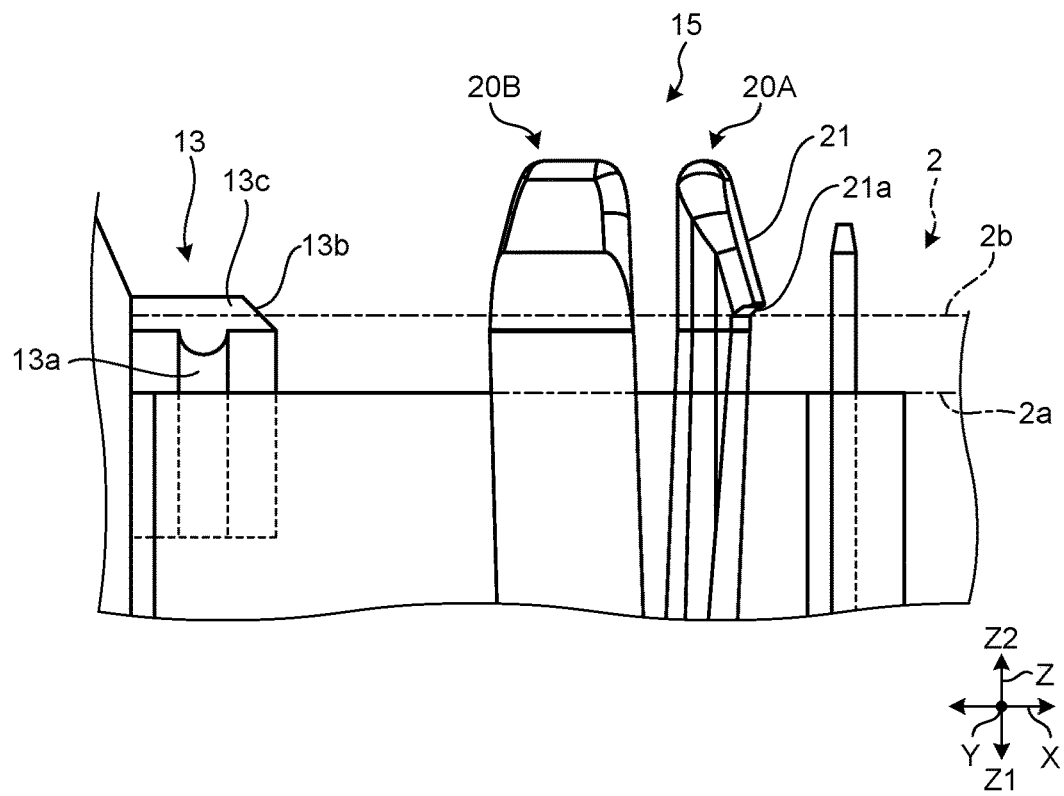
FIG. 4B is a partial side view illustrating the schematic configuration of the fixing structure in the electrical junction box according to the embodiment.

As illustrated in FIGS. 2, 4A, and 4B, a regulation portion 21 that is formed projecting radially outward from the outer peripheral surface and regulates movement in the insertion and removal direction of the circuit board 2 between the regulation portion 21 and the support portion 14 in an insertion state in which the projecting portion 15 is inserted through the penetration hole 4 is formed in the divided piece 20A out of the three divided pieces 20A to 20C. The regulation portion 21 is formed on the outer peripheral surface on the distal end side of the divided piece 20A. In other words, the regulation portion 21 is formed on the outer peripheral surface on the removal direction side of the divided piece 20A. A chamfered portion 21a is formed in an end surface in the insertion direction of the regulation portion 21. For example, the chamfered portion 21a is formed using a mold draft, and is inclined to the radial inner side of the projecting portion 15 from the outermost periphery of the regulation portion 21, toward the support portion 14 from the distal end of the divided piece 20A. The chamfered portion 21a faces the second surface 2b of the circuit board 2 in the above insertion state to regulate the movement in the removal direction of the circuit board 2. That is, the movement in the removal direction of the circuit board 2 is regulated by the chamfered portion 21a of the regulation portion 21, and the movement in the insertion direction thereof is regulated by the support portion 14 in the above insertion state.

The regulation portion 21 is not provided in the divided pieces 20B and 20C out of the three divided pieces 20A to 20C. That is, the regulation portion 21 is formed in the divided piece 20A that is farthest from the positioning surface 12 in the perpendicular direction in the above insertion state, out of the three divided pieces 20A to 20C.

The inclined rib 16 projects from an outer peripheral surface in the removal direction of outer peripheral surfaces of the housing 11, and is formed in a trapezoidal shape as viewed from the width direction of the housing 11. Two of the inclined ribs 16 are formed at opposite ends in the width direction of the housing 11 so as to face each other in the width direction. The respective inclined ribs 16 have inclined surfaces 16a. The inclined surfaces 16a are formed continuously from the positioning surface 12, and are inclined so as to separate farther from the circuit board 2 in the removal direction of the insertion and removal direction in the above abutment state.

Next, an assembly work for fixing the circuit board 2 to the housing 11 of the board connector 10 in the electrical junction box 1 of the present embodiment will be described. First, an assembly worker sets the board connector 10 in a support jig 40 illustrated in FIG. 3 in the insertion direction. In the support jig 40, for example, a recessed portion is formed on the first side in the depth direction of an inner bottom surface, and the second side in the depth direction of the bottom surface is formed continuously from a bottom surface of the recessed portion.

Subsequently, the assembly worker sets the circuit board 2 in the board connector 10 set in the support jig 40 in the insertion direction. At this time, the assembly worker aligns the slit 3 of the circuit board 2 with the positioning rib 13 of the board connector 10 while visually checking the insertion direction. Distal ends on the removal direction side of the respective projecting portions 15 are then inserted into the corresponding penetration holes 4 of the circuit board 2. The circuit board 2 is pressed down in the insertion direction. The three divided pieces 20A to 20C constituting each of the projecting portions 15 are elastically deformed toward the axis of the projecting portion 15, so that an inner surface of the penetration hole 4 climbs over the regulation portion 21 of the divided piece 20A. At this time, the positioning rib 13 is inserted into the slit 3 of the circuit board 2 with the end 2c of the circuit board 2 in abutment with the positioning surface 12 of the housing 11. When the first surface 2a of the circuit board 2 comes into abutment with the support portions 14, the regulation portions 21 of the divided pieces 20A are inserted through the penetration holes 4, and the connection terminals 41 are inserted through the through holes 2d of the circuit board 2. The connection terminals 41 come into the insertion state through the through holes 2d of the circuit board 2 in a state in which the positioning rib 13 is inserted into the slit 3 and the projecting portions 15 are inserted through the penetration holes 4 to regulate the movement of the circuit board 2 by the regulation portions 21. At this time, the circuit board 2 is temporarily fixed to the board connector 10. Subsequently, the assembly worker solders the connection terminals 41 inserted through the through holes 2d of the circuit board 2 to the through holes 2d. The board connector 10 is fixed to the circuit board 2 by soldering the connection terminals 41 to the through holes 2d as described above. When the connection terminals 41 are soldered to the through holes 2d of the circuit board 2, any soldering method may be employed.

In the above assembly work, if the circuit board 2 is displaced to the second side in the depth direction in fixing the circuit board 2 to the board connector 10, the end 2c of the circuit board 2 comes into contact with the inclined surfaces 16a to be guided to the positioning surface 12 while sliding along the inclined surfaces 16a as illustrated in FIG. 5. This makes the assembly work easy, improving the work efficiency of the assembly worker.

Figure 6B:
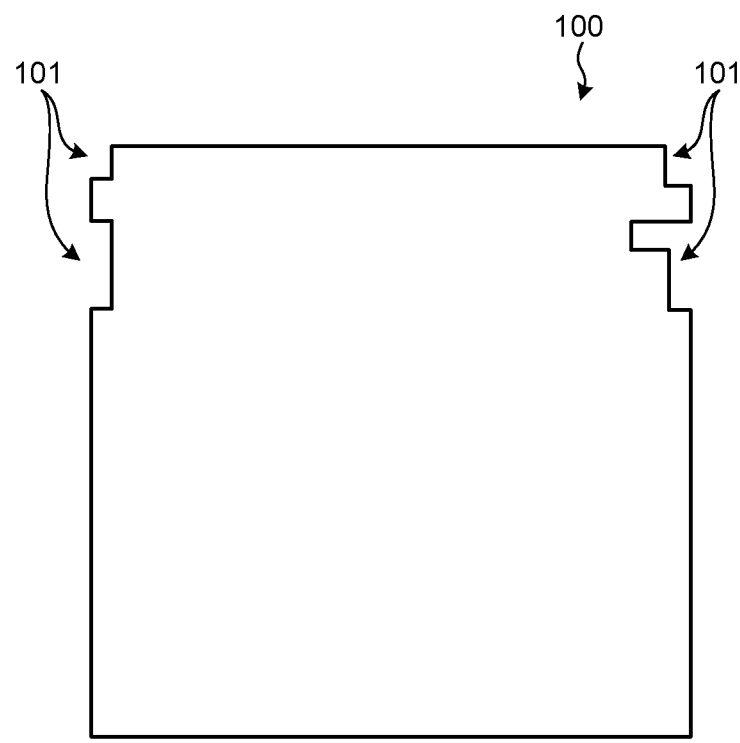
FIG. 6B is a plan view illustrating a schematic configuration of a conventional circuit board.

In the electrical junction box 1 of the present embodiment, the circuit board 2 includes the slit 3 provided in the linear end 2c, and the two penetration holes 4 arranged parallel to the end 2c with the slit 3 therebetween. Thus, the circuit board 2 can be formed without providing a plurality of cutouts 101 as in a conventional circuit board 100 illustrated in FIG. 6B. Machining costs can be thereby reduced.

In the electrical junction box 1 of the present embodiment, the positioning rib 13 is inserted into the slit 3 to come into contact with the circuit board 2 in the width direction of the slit 3 in the abutment state in which the end 2c of the circuit board 2 is in abutment with the positioning surface 12. Widthwise looseness of the circuit board 2 can be thereby prevented. The assembly worker can also insert the positioning rib 13 into the slit 3 while visually checking the targeted positioning rib 13 during the assembly work. The assembly workability can be thereby improved.

In the electrical junction box 1 of the present embodiment, the projecting portions 15 are formed corresponding to the respective penetration holes 4, and are inserted through the penetration holes 4 in the above abutment state and in the insertion state in which the positioning rib 13 is inserted into the slit 3. The connection terminals 41 are inserted through the through holes 2d of the circuit board 2 in the insertion state in which the projecting portions 15 are inserted through the penetration holes 4. This enables the circuit board 2 to be temporarily fixed to the board connector 10 at the positions of the slit 3 and the two penetration holes 4 without using a screwing bit. Thus, it is possible to easily create the state in which the connection terminals 41 are inserted through the through holes 2d of the circuit board 2, and fix the circuit board 2 to the board connector 10 by soldering the connection terminals 41 to the through holes 2d. As a result, the circuit board 2 can be easily fixed to the board connector 10 while protecting the electronic components mounted on the circuit board 2, resulting in reduction of working costs. Since a fastening member such as a screw is not used, component costs can be also reduced.

Figure 7:
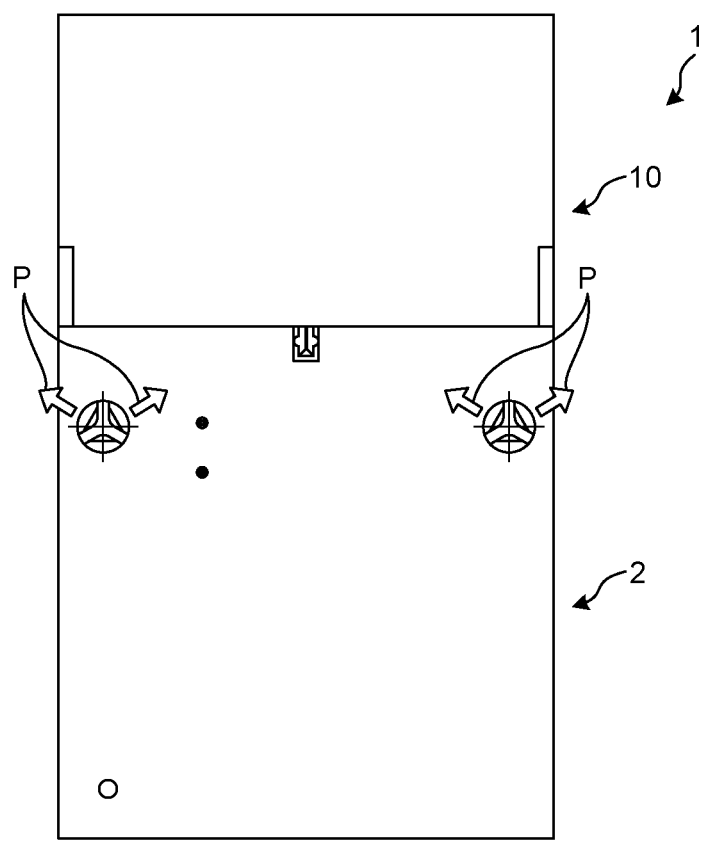
FIG. 7 is a schematic view illustrating a pressing direction of the circuit board by projecting portions in the electrical junction box according to the embodiment.

In the electrical junction box 1 of the present embodiment, the end 2c of the circuit board 2 is in abutment with the positioning surface 12 and each of the projecting portions 15 presses the circuit board 2 radially outward by an elastic force generated by the elastic deformation of the three divided pieces 20A to 20C in the insertion state in which the projecting portion 15 is inserted through the penetration hole 4. The divided pieces 20B and 20C that are closest to the positioning surface 12 in the depth direction thereby press the circuit board 2 toward the positioning surface 12 by an elastic force P as illustrated in FIG. 7. As a result, depth looseness of the circuit board 2 can be prevented.

In the electrical junction box 1 of the present embodiment, the regulation portions 21 regulate the movement in the insertion and removal direction of the circuit board 2 between the regulation portions 21 and the support portions 14 in the above insertion state. The circuit board 2 can be thereby prevented from falling off from the board connector 10 in the removal direction.

In the electrical junction box 1 of the present embodiment, each of the regulation portions 21 is formed in the divided piece 20A that is farthest from the positioning surface 12 in the depth direction (X direction) in the above insertion state, out of the three divided pieces 20A to 20C. Thus, the projecting portions 15 can be more easily passed through the penetration holes 4 as compared with a case in which the regulation portions 21 are provided in all the divided pieces 20A to 20C.

Additionally, the regulation portions 21 are formed in the divided pieces 20A that are farthest from the positioning surface 12. Thus, the circuit board 2 can be prevented from falling off when an end on the first side in the depth direction of the circuit board 2 is pulled up in the removal direction as compared with a case in which the regulation portions 21 are formed in the divided pieces 20B and 20C.

In the electrical junction box 1 of the present embodiment, the housing 11 includes the inclined surfaces 16a formed continuously from the positioning surface 12 and inclined so as to separate farther from the circuit board 2 in the removal direction in the above abutment state.

Thus, even if the circuit board 2 is displaced to the second side in the depth direction in fixing the circuit board 2 to the board connector 10, the end 2c of the circuit board 2 comes into contact with the inclined surfaces 16a to be guided to the positioning surface 12 while sliding along the inclined surfaces 16a. The work efficiency of the assembly worker can be thereby improved.

Figure 8A:
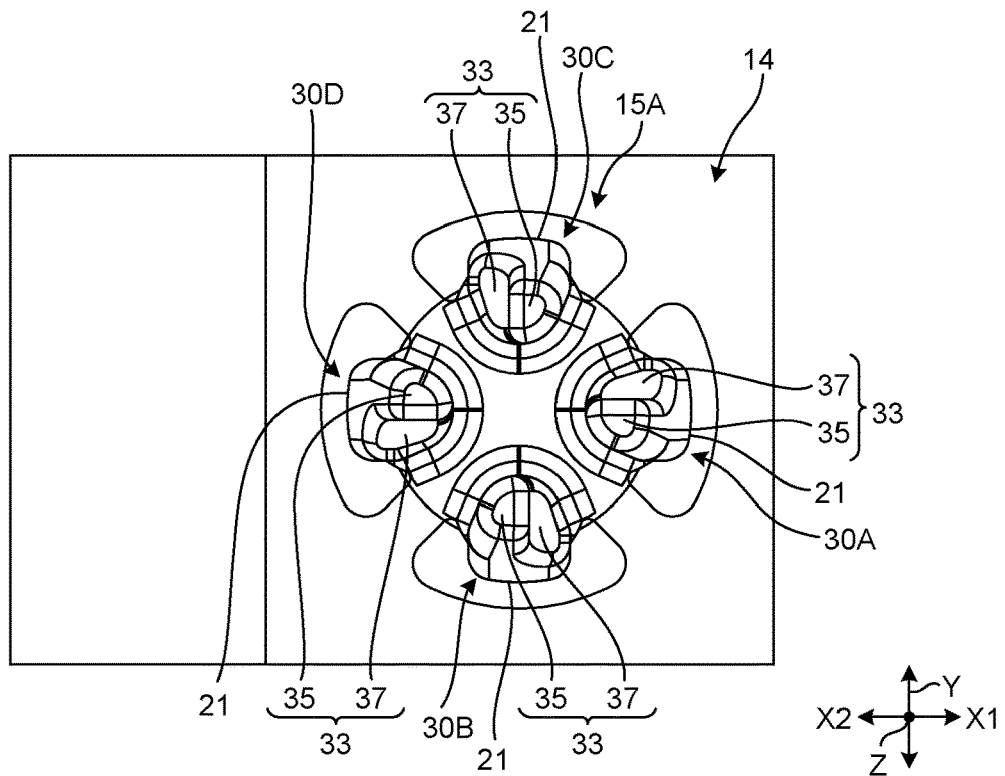
FIG. 8A is a partial plan view illustrating a schematic configuration of a fixing structure of a board connector according to a modification of the embodiment.
Figure 8B:
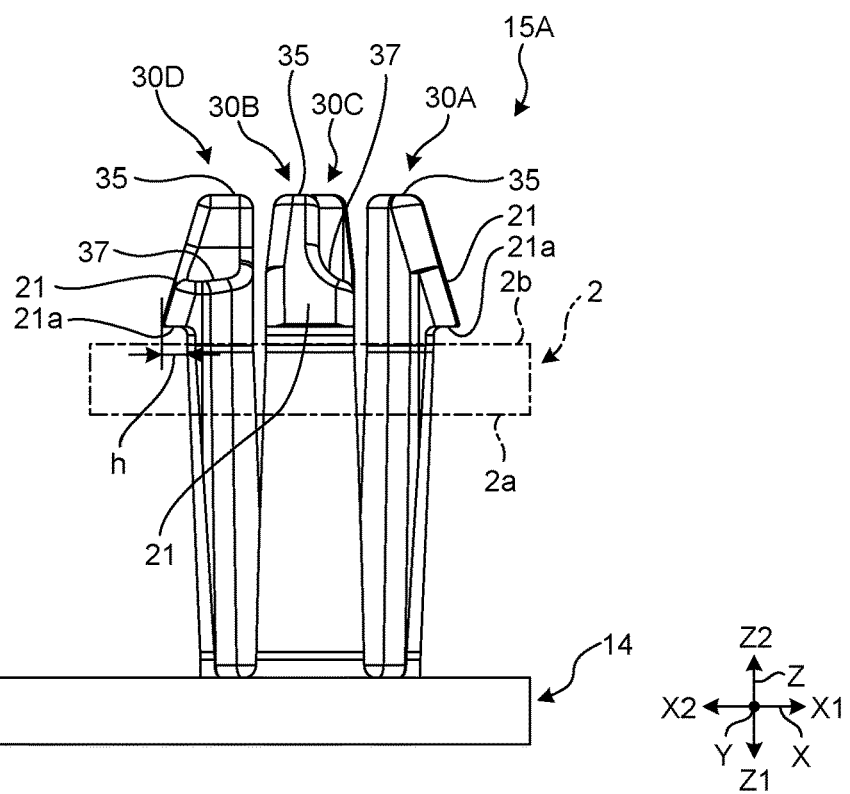
FIG. 8B is a partial side view illustrating a schematic configuration of a projecting portion according to the modification of the embodiment.
Figure 9A:
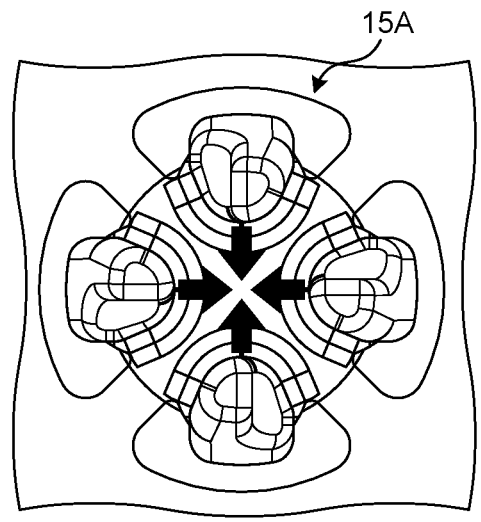
FIG. 9A is a view illustrating a state before deformation of the projecting portion according to the modification of the embodiment.
Figure 9B:
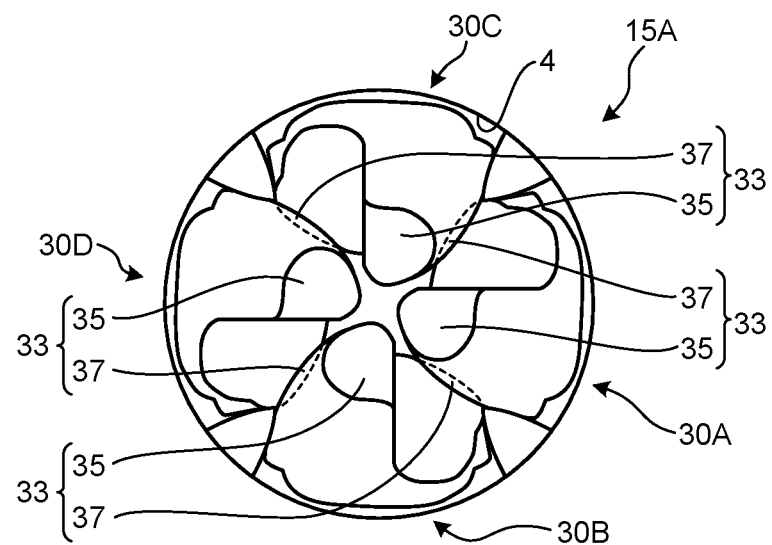
FIG. 9B is a view illustrating a state after deformation of the projecting portion according to the modification of the embodiment.
Figure 9C:
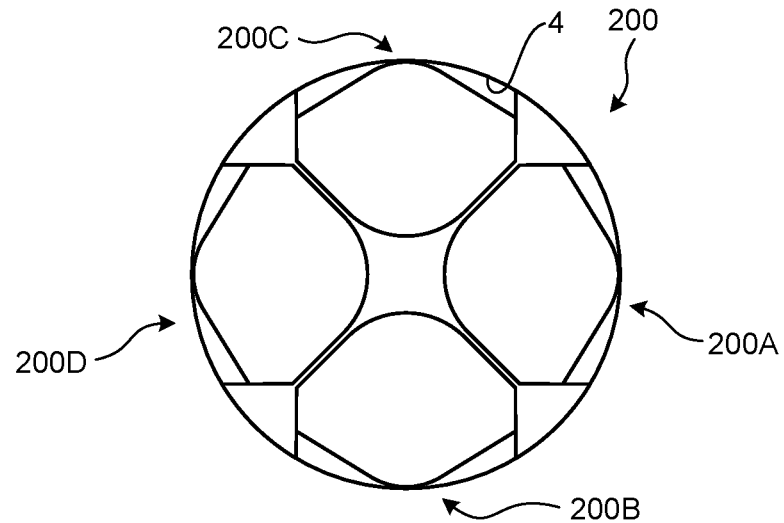
FIG. 9C is a view illustrating a state after deformation of a conventional projecting portion.

While each of the projecting portions 15 includes the three divided pieces 20A to 20C in the above embodiment, the present invention is not limited to this configuration. FIG. 8A is a partial plan view illustrating a schematic configuration of a fixing structure of a board connector according to a modification of the embodiment. FIG. 8B is a partial side view illustrating a schematic configuration of a projecting portion according to the modification of the embodiment. FIG. 9A is a view illustrating a state before deformation of the projecting portion according to the modification of the embodiment. FIG. 9B is a view illustrating a state after deformation of the projecting portion according to the modification of the embodiment. FIG. 9C is a view illustrating a state after deformation of a conventional projecting portion.

As illustrated in FIGS. 8A and 8B, a projecting portion 15A includes four divided pieces 30A to 30D circumferentially divided by four slits extending toward its axis from its outer peripheral surface so as to be formed individually elastically deformable in a radial direction. A distal end portion 35 and a cutout portion 37 are formed in a circumferential direction of a distal end 33 of each of the divided pieces 30A to 30D. The cutout portions 37 are formed on one side in the circumferential direction of the distal ends 33 adjacent to each other in the circumferential direction. The distal end portions 35 are formed on the other side in the circumferential direction of the distal ends 33 adjacent to each other in the circumferential direction. Each of the divided pieces 30A to 30D has the regulation portion 21. The regulation portion 21 has the chamfered portion 21a having a margin h for radially engaging with the circuit board 2.

The four divided pieces 30A to 30D constituting the projecting portion 15A are elastically deformed toward the axis of the projecting portion 15A (FIG. 9A), so that an inner surface of the penetration hole 4 climbs over the regulation portions 21 of the respective divided pieces 30A to 30D. When the projecting portion 15A is inserted into the penetration hole 4, the distal end portion 35 of one of the distal ends 33 adjacent to each other in the circumferential direction is inserted into the cutout portion 37 of the other of the distal ends 33 adjacent to each other in the circumferential direction (FIG. 9B). Thus, an elastic deformation amount of each of the divided pieces 30A to 30D can be increased to 0.5 mm as compared with a case in which an elastic deformation amount of each of divided pieces 200A to 200D of a conventional projecting portion 200 illustrated in FIG. 9C toward its axis is 0.3 mm. In the conventional projecting portion 200, the engagement margin h is 0.3 mm or less, which is more decreased with a minimum value of a dimensional tolerance. In the projecting portion 15A, the deformation amount of each of the divided pieces 30A to 30D is increased. Thus, the engagement margin can be increased. As a result, a holding force of the circuit board 2 by the projecting portion 15A of the board connector 10 can be enhanced.

In the above embodiment, the projecting portions 15 come into the insertion state through the penetration holes 4 before the positioning rib 13 is inserted into the slit 3 in attaching the circuit board 2 to the housing 11. However, the present invention is not limited to this configuration. For example, the height in the removal direction of the positioning rib 13 may be made larger than the height in the removal direction of the projecting portions 15, or the height in the removal direction of the projecting portions 15 may be made smaller than the height in the removal direction of the positioning rib 13. Thus, the positioning rib 13 comes into the insertion state into the slit 3 before the projecting portions 15 are inserted through the penetration holes 4 in attaching the circuit board 2 to the housing 11. In addition to the above configuration, the heights in the removal direction of the positioning rib 13 and the projecting portions 15 may be set such that the positioning rib 13 is inserted into the slit 3 and the projecting portions 15 are inserted through the penetration holes 4 at the same time in attaching the circuit board 2 to the housing 11.

The electrical junction box according to the present embodiment provides such an effect that the circuit board can be easily fixed to the board connector while protecting electronic components.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical junction box comprising:
a circuit board; and
a board connector including a housing holding a connection terminal and fixed to the circuit board, wherein
the circuit board includes
a slit provided in a linear end, and
a plurality of penetration holes provided at positions different from a through hole to which the connection terminal is soldered, and arranged parallel to the linear end with the slit therebetween,
the housing includes
a positioning surface in abutment with the linear end of the circuit board,
a positioning rib formed projecting from the positioning surface in a perpendicular direction perpendicular to the positioning surface, and inserted into the slit to come into contact with the circuit board at least in a width direction of the slit in an abutment state in which the end of the circuit board is in abutment with the positioning surface,
a support portion formed corresponding to each of the penetration holes, formed projecting from the positioning surface and extending toward the circuit board, and coming into abutment with a first surface of the circuit board in the abutment state to support the circuit board, and
a projecting portion formed projecting from the support portion toward the circuit board, and inserted through each of the penetration holes,
the projecting portion includes a plurality of divided pieces circumferentially divided by a plurality of slits extending toward an axis from an outer peripheral surface so as to be formed individually elastically deformable in a radial direction,
a regulation portion formed projecting radially outward from the outer peripheral surface and regulating movement in an insertion and removal direction of the circuit board between the regulation portion and the support portion in an insertion state in which the projecting portion is inserted through the penetration hole is formed in at least one of the divided pieces,
the connection terminal comes into an insertion state through the through hole of the circuit board in an insertion state in which the positioning rib is inserted into the slit, and in a state in which the projecting portion is inserted through the penetration hole to regulate the movement of the circuit board by the regulation portion, and
the board connector is fixed to the circuit board by soldering the connection terminal to the through hole.

2. The electrical junction box according to claim 1, wherein
the regulation portion is formed in the divided piece farthest from the positioning surface in the perpendicular direction in the insertion state, out of the divided pieces.

3. The electrical junction box according to claim 1, wherein
a distal end portion and a cutout portion are formed in a circumferential direction of a distal end of each of the divided pieces,
the cutout portions are formed on one side in the circumferential direction of the distal ends adjacent to each other in the circumferential direction,
the distal end portions are formed on the other side in the circumferential direction of the distal ends adjacent to each other in the circumferential direction, and
the distal end portion of one of the distal ends adjacent to each other in the circumferential direction is inserted into the cutout portion of the other of the distal ends adjacent to each other in the circumferential direction when the projecting portion is inserted into the penetration hole.

4. The electrical junction box according to claim 2, wherein
a distal end portion and a cutout portion are formed in a circumferential direction of a distal end of each of the divided pieces,
the cutout portions are formed on one side in the circumferential direction of the distal ends adjacent to each other in the circumferential direction,
the distal end portions are formed on the other side in the circumferential direction of the distal ends adjacent to each other in the circumferential direction, and
the distal end portion of one of the distal ends adjacent to each other in the circumferential direction is inserted into the cutout portion of the other of the distal ends adjacent to each other in the circumferential direction when the projecting portion is inserted into the penetration hole.

5. The electrical junction box according to claim 1, wherein
the housing includes an inclined surface formed continuously from the positioning surface, and inclined so as to separate farther from the circuit board in a removal direction of the insertion and removal direction in the abutment state.

6. The electrical junction box according to claim 2, wherein
the housing includes an inclined surface formed continuously from the positioning surface, and inclined so as to separate farther from the circuit board in a removal direction of the insertion and removal direction in the abutment state.

7. The electrical junction box according to claim 3, wherein
the housing includes an inclined surface formed continuously from the positioning surface, and inclined so as to separate farther from the circuit board in a removal direction of the insertion and removal direction in the abutment state.

* * * * *